(12) United States Patent
Bello et al.

(10) Patent No.: US 10,931,143 B2
(45) Date of Patent: Feb. 23, 2021

(54) RECHARGEABLE WAFER CARRIER SYSTEMS

(71) Applicant: GLOBALFOUNDRIES Inc., Grand Cayman (KY)

(72) Inventors: Abner Bello, Clifton Park, NY (US); Stephanie Waite, Glens Falls, NY (US); William J. Fosnight, Saratoga Springs, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 575 days.

(21) Appl. No.: 15/233,454

(22) Filed: Aug. 10, 2016

(65) Prior Publication Data

US 2018/0048169 A1 Feb. 15, 2018

(51) Int. Cl.
*H02J 50/10* (2016.01)
*H02J 7/00* (2006.01)
(Continued)

(52) U.S. Cl.
CPC .......... *H02J 50/10* (2016.02); *H01L 21/6773* (2013.01); *H01L 21/67379* (2013.01);
(Continued)

(58) Field of Classification Search
CPC ........ H02J 7/0044; H02J 7/0025; H02J 50/10; H02J 7/025; H01L 21/66831; H01L 21/67051; H01L 21/67379; H01L 21/67386; H01L 21/67396; H01L 21/6773; H01L 21/67736; H01L 21/67775; H01M 4/661
(Continued)

(56) References Cited

U.S. PATENT DOCUMENTS 3,848,188 A 11/1974 Ardezzone et al.
5,837,986 A 11/1998 Barile et al.
(Continued)

OTHER PUBLICATIONS

U.S. Appl. No. 15/193,502, filed Jun. 27, 2016, titled Self-Contained Metrology Wafer Carrier Systems.
(Continued)

*Primary Examiner* — M Baye Diao
(74) *Attorney, Agent, or Firm* — Thompson Hine LLP; Francois Pagette (57) ABSTRACT

Rechargeable wafer carrier systems and methods are provided. A rechargeable wafer carrier system includes, for instance, a housing for holding at least one wafer and at least one electronics system therein, a rechargeable power source operably connected to the housing for powering the at least one electronics system, and a charging interface for receiving a supply of power for charging the rechargeable power source. The housing may be configured for transport within an automated material handling system. Also provided are methods of charging a rechargeable wafer carrier system, which includes, for instance, providing a rechargeable wafer carrier system having at least one electronics system and a rechargeable power source, operably connecting the rechargeable wafer carrier system to a charging base, and supplying power from the charging base to the rechargeable power source.

14 Claims, 9 Drawing Sheets

(51) Int. Cl.
*H02J 7/02* (2016.01)
*H01L 21/677* (2006.01)
*H01L 21/673* (2006.01)

(52) U.S. Cl.
CPC .. *H01L 21/67386* (2013.01); *H01L 21/67396* (2013.01); *H01L 21/67736* (2013.01); *H01L 21/67775* (2013.01); *H02J 7/0044* (2013.01); *H02J 7/025* (2013.01)

(58) Field of Classification Search
USPC ....................................................... 320/115
See application file for complete search history.

(56) References Cited

U.S. PATENT DOCUMENTS

| | | | | |
|---|---|---|---|---|
| 5,955,857 | A * | 9/1999 | Kwon | G05B 19/4189 318/568.11 |
| 5,963,315 | A * | 10/1999 | Hiatt | H01L 21/67745 356/237.3 |
| 6,249,342 | B1 * | 6/2001 | Cheng | G01R 31/2887 356/237.2 |
| 6,798,513 | B2 | 9/2004 | Abraham | |
| 6,884,639 | B2 * | 4/2005 | Dougan | H01L 21/67253 269/288 |
| 6,993,405 | B2 * | 1/2006 | Beaulieu | H01L 21/67248 198/300 |
| 7,106,425 | B1 * | 9/2006 | Bultman | G01N 21/211 356/237.2 |
| 7,135,852 | B2 * | 11/2006 | Renken | H01L 21/67253 438/5 |
| 7,282,889 | B2 * | 10/2007 | Freed | H02J 50/12 320/108 |
| 7,531,984 | B2 * | 5/2009 | Freed | H02J 7/025 320/109 |
| 9,064,406 | B1 | 6/2015 | Stevens et al. | |
| 9,356,822 | B2 * | 5/2016 | Jensen | H04L 67/34 |
| 2002/0101508 | A1 | 8/2002 | Pollack | |
| 2002/0118365 | A1 * | 8/2002 | Kessel | H01N 21/67242 356/445 |
| 2003/0001083 | A1 * | 1/2003 | Corrado | G01D 11/245 250/239 |
| 2003/0002043 | A1 | 1/2003 | Abdulhalim et al. | |
| 2004/0154417 | A1 * | 8/2004 | Renken | H01L 21/67253 73/866.1 |
| 2007/0011836 | A1 * | 1/2007 | Brewer | A46B 15/0002 15/220.1 |
| 2007/0229833 | A1 * | 10/2007 | Rosencwaig | G01B 11/303 356/426 |
| 2008/0305563 | A1 | 12/2008 | Ko et al. | |
| 2009/0053837 | A1 * | 2/2009 | Khoche | G01R 31/2893 438/14 |
| 2010/0049353 | A1 | 2/2010 | Takizawa et al. | |
| 2011/0001971 | A1 * | 1/2011 | Iwanami | G01R 29/0885 356/364 |
| 2011/0074341 | A1 * | 3/2011 | Jensen | H01L 21/67253 320/108 |
| 2013/0258093 | A1 * | 10/2013 | Jingu | G01N 21/9501 348/92 |
| 2015/0006103 | A1 | 1/2015 | De Wel et al. | |
| 2016/0370797 | A1 * | 12/2016 | Azarya | H01L 21/67253 |

OTHER PUBLICATIONS

U.S. Continuation U.S. Appl. No. 15/876,472, including Preliminary Amendment, filed Jan. 22, 2018, titled "Self-Contained Metrology Wafer Carrier Systems".

Bello et al., "Self-Contained Metrology Wafer Carrier Systems", U.S. Appl. No. 16/248,220, filed Jan. 15, 2019.

* cited by examiner

RECHARGEABLE WAFER CARRIER SYSTEMS

FIELD OF THE DISCLOSURE

The present disclosure relates to wafer carrier systems, and more particularly, to rechargeable wafer carrier systems, such as for use in an automated semiconductor fabrication plant.

BACKGROUND OF THE DISCLOSURE

In an automated semiconductor fabrication plant setting, wafers are contained in a wafer carrier which is transported between stations via an automated material handling system (AMHS). A station could be a process tool to deposit or to etch films, or a metrology tool to measure characteristics of the films. A wafer carrier in an automated semiconductor fabrication plant is also known as a front opening unified pod and is commonly referred to as a FOUP. A FOUP is typically formed of a specialized plastic housing, which is designed to hold semiconductor wafers securely and safely in a protective environment. A FOUP includes a front opening section which allows the wafers to be inserted therein and removed therefrom for processing.

A significant amount of time can be incurred in transporting the FOUP from station to station, particularly if the fabrication plant is large or if there are numerous steps in completing the manufacturing process. Typically, after processing wafers at a station, the FOUP including the processed wafers, are transported to a metrology station for measurement. Often, after further transporting and processing of the wafers at each subsequent station, the FOUP is transported to the metrology station for further measurement. Metrology equipment is expensive and occupies cleanroom floor space. When an action is not being taken on the wafer, the FOUP may be transported to a storage unit awaiting next action.

SUMMARY OF THE DISCLOSURE

The shortcomings of the prior art are overcome and additional advantage are provided through the provisions of a rechargeable wafer carrier system, which includes, for instance, a housing for holding at least one wafer and at least one electronics system therein, a rechargeable power source operably connected to the housing for powering the at least one electronics system, and a charging interface for receiving a supply of power for charging the rechargeable power source. The housing may be configured for transport within an automated material handling system.

The rechargeable wafer carrier system may be operable with one or more of an automated material handling system, a storage unit, a charging station, a wafer processing station, and a wafer metrology station. A portion of the charging interface for receiving a supply of power may be disposed on a wall of the housing. The charging interface for receiving a supply of power may include a coil or may include an electrical receptor.

The rechargeable wafer carrier system may include at least one electronics system within the housing. The at least one electronics system may include, for instance, a computing unit. The at least one electronics system may also include, for example, a metrology system operable to measure at least one characteristic of the wafer within the housing.

The rechargeable wafer carrier system may also include a charging base for providing the supply of power for charging the rechargeable power source. The charging base may include a power supply interface operable with the charging interface of the rechargeable wafer carrier system. The power supply interface may be, for instance, movably connectable to the charging interface of the rechargeable wafer carrier system. The charging base may further include, for instance, a wafer carrier storage unit, a charging station, a wafer metrology station, and a wafer processing station.

The rechargeable wafer carrier system may include at least one alignment interface for aligning the housing and the charging interface with a charging base. The at least one alignment interface may include a power supply interface operable with the charging interface of the rechargeable wafer carrier system.

In another embodiment, a method for charging a rechargeable wafer carrier system is disclosed. The method includes, for instance, providing a rechargeable wafer carrier system of the present disclosure, positioning the rechargeable wafer carrier system on a charging base, and supplying power to the rechargeable power source from the charging base.

In another embodiment, another method for charging a rechargeable wafer carrier system is disclosed. The method includes, for instance, providing a rechargeable wafer carrier system having an electronics system and a rechargeable power source, operably connecting the rechargeable wafer carrier system to a charging base, and supplying power from the charging base to the rechargeable power source. The supplying power may include, for instance, supplying power via inductive charging or via electrical connection. The supplying power may include supplying power while the rechargeable wafer carrier system is within an automated material handling system. The supplying power may include supplying power from at least one of an automated material handling system, a wafer carrier storage unit, a charging station, a wafer metrology station, and a wafer processing station.

Additional features and advantages are realized through the principles of the present disclosure. Other embodiments of the disclosure are described in detail herein and are considered to be part of the claimed disclosure.

BRIEF DESCRIPTION OF THE DRAWINGS

One or more embodiments of the present disclosure are particularly pointed out and distinctly claimed as examples in the claims at the conclusion of the specification. The foregoing and other objects, features, and advantages of the disclosure are apparent from the following detailed description taken in conjunction with the accompanying drawings in which:

DETAILED DESCRIPTION OF THE DISCLOSURE

The present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the disclosure in detail. It should be understood, however, that the detailed description and the specific examples, while indicating embodiments of the disclosure, are given by way of illustration only, and are not by way of limitation. Various substitutions, modifications, additions and/or arrangements within the spirit and/or scope of the underlying concepts will be apparent to those skilled in the art from this disclosure. Note that these figures are not drawn to scale in order to facilitate understanding of the disclosure, and that the same reference numerals used throughout different figures designate the same or similar elements.

Rechargeable wafer carrier systems of the present disclosure may include a housing, a rechargeable power source for powering one or more electronics systems, and a charging interface. The electronics system may include, for instance, one or more metrology systems, sensors, cameras, communication devices, or any electronic device that requires power. For instance, where the electronics system is a metrology system, the metrology system may be a self-contained metrology instrument for measuring one or more characteristics of a wafer or wafers contained in the rechargeable wafer carrier system, for example, after processing at a station and prior to processing at the next station.

Rechargeable wafer carrier systems of the present disclosure may be used with and transported by, for example, an automated transport system such as an automated material handling system (AMHS) in place in an automated fabrication plant, commonly referred to as a fab. As will be appreciated, rechargeable wafer carrier systems of the present disclosure may receive or include a self-contained electronics system, for example, a metrology instrument, and a rechargeable power source, for example, a rechargeable battery, and may avoid the need to transport the wafers to separate metrology stations. The rechargeable power source may be, for instance, a rechargeable battery, for example, a nickel cadmium (NiCd) battery, a nickel metal hydride (NIMH) battery, a lithium ion (Li-ion) battery, and a lithium ion polymer (Li-ion polymer) battery. Such rechargeable wafer carrier systems may expand in the applications and uses in an AMHS.

FIGS. 1-10 depict, by way of example, rechargeable wafer carrier systems and methods for charging rechargeable wafer carrier systems according to embodiments of the present disclosure.

Figure 1:
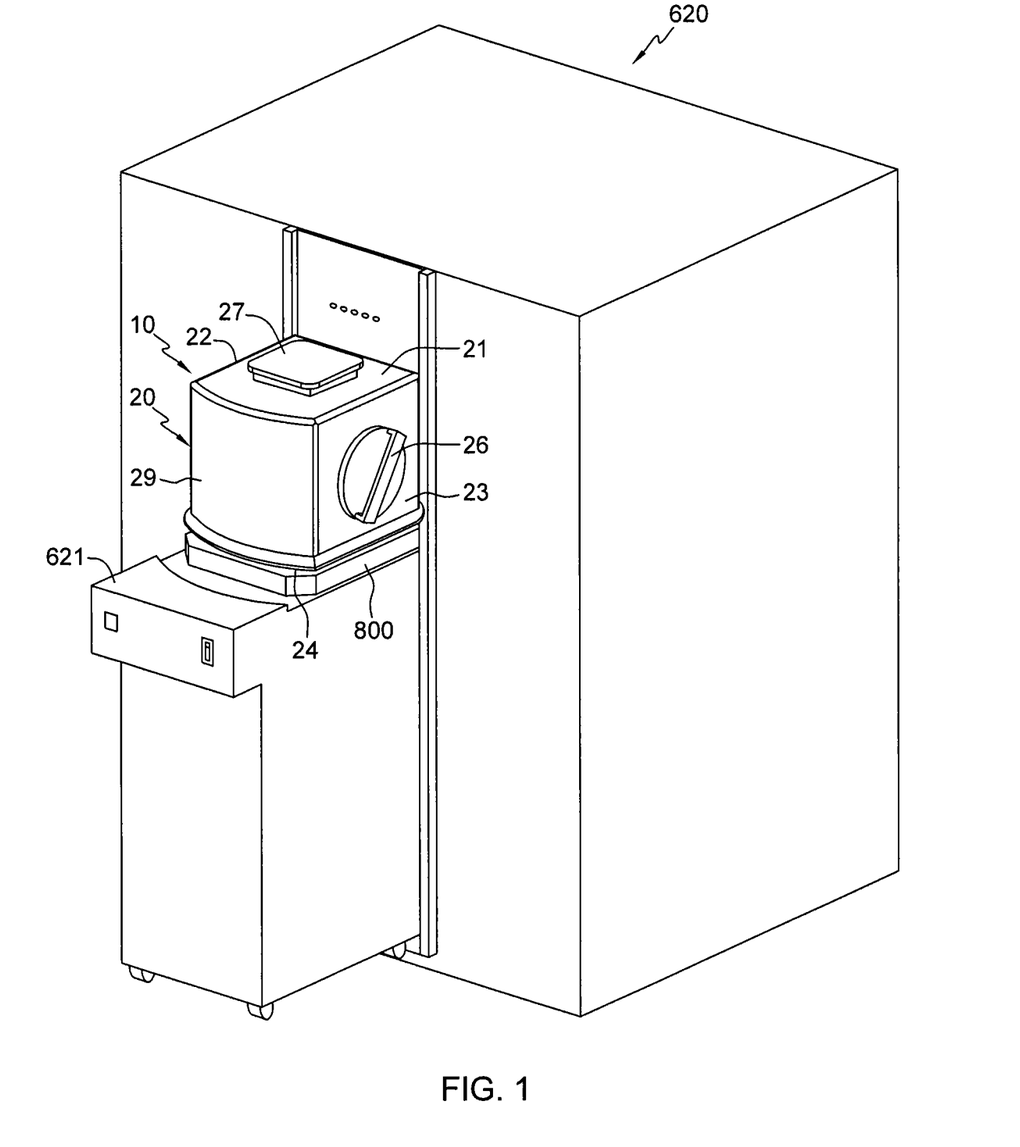
FIG. 1 is a perspective view of a rechargeable wafer carrier system and a processing station with a charging base according to an embodiment of the present disclosure.
Figure 2:
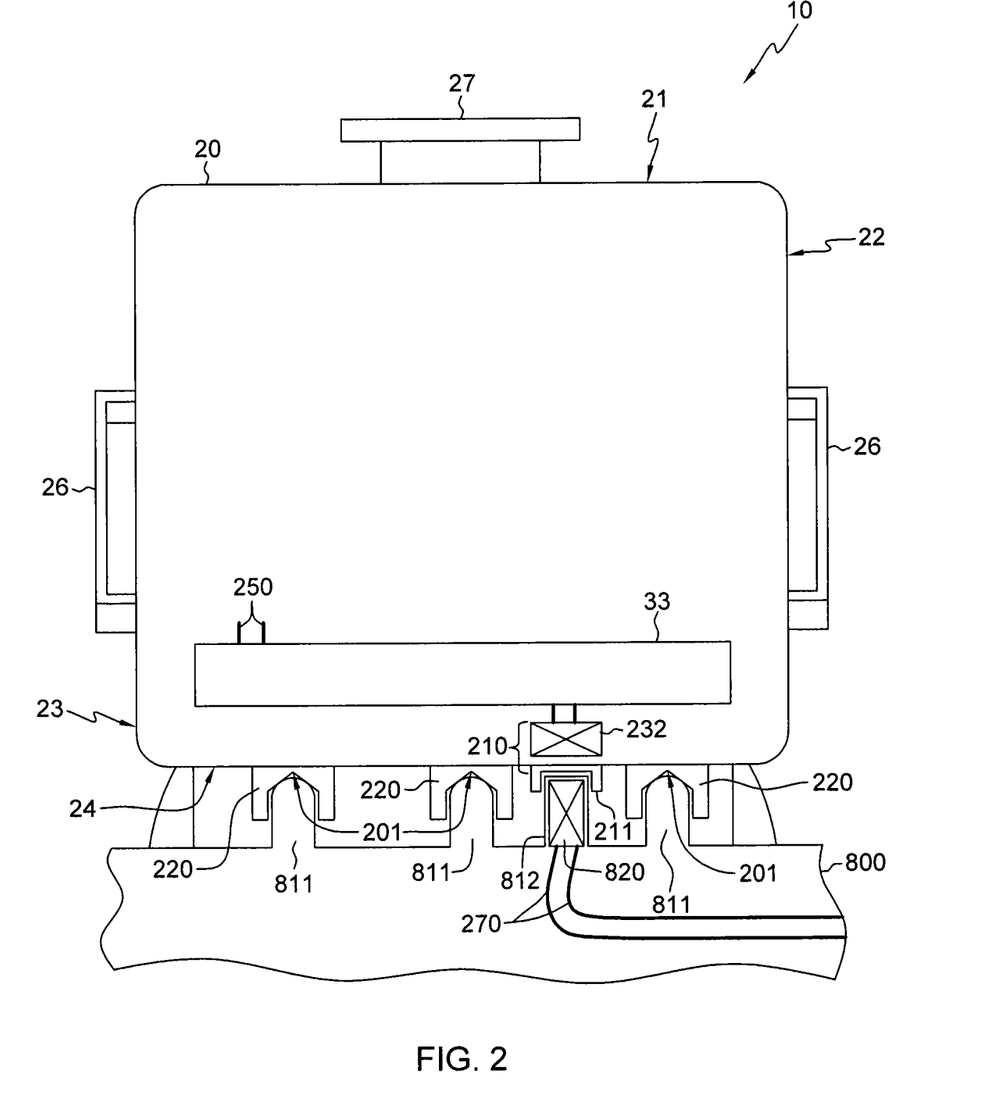
FIG. 2 is an enlarged elevational view, in part cross-section, of the rechargeable wafer carrier system and a portion of the charging base of FIG. 1.
Figure 3:
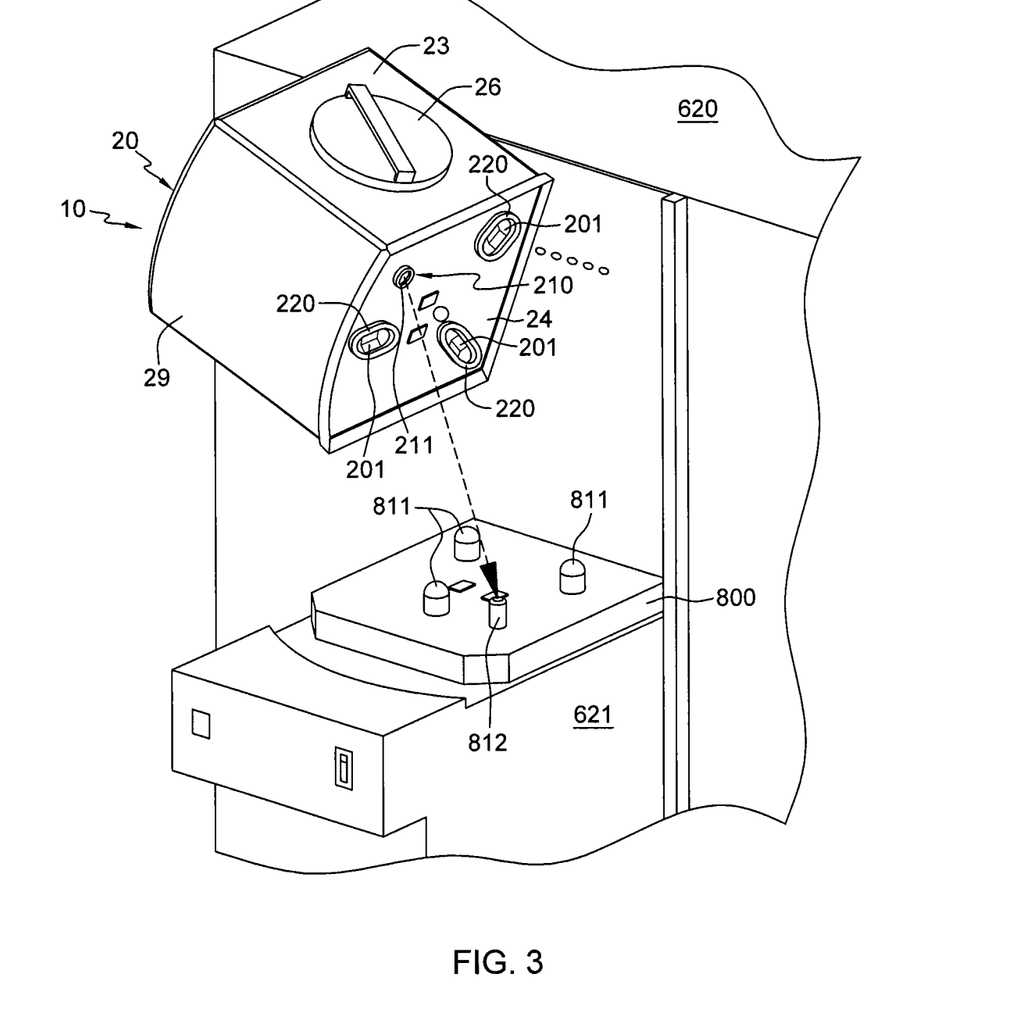
FIG. 3 is a perspective view of the rechargeable wafer carrier system prior to engagement with the charging base of FIG. 1.

FIGS. 1-3 illustrate a rechargeable wafer carrier system 10 according to an embodiment of the present disclosure. As shown in FIG. 1, rechargeable wafer carrier system 10 may be positioned on a charging base 800, for instance, on a load port 621 of a processing station 620. Rechargeable wafer carrier system 10 may generally include a housing 20 having a top wall 21, side walls 22 and 23, a bottom wall 24, a rear wall 29, and a front wall (not shown), which may also be referred to as a front door. Housing 20 may also include an adaptor 27 and handles 26 (only one of which is shown in FIG. 1) for use with or engageable with an automated transport system, for example, an AMHS, or robots. Housing 20 may include additional features that allow it to function in an automated fabrication plant.

For example, housing 20 may include adaptor 27 operably connectable to a robot or engageable with an AMHS for transporting rechargeable wafer carrier system 10 from one station to the next, or to other locations within the automated fabrication plant. For instance, rechargeable wafer carrier system 10 may be transported from a first station to a second station, to a third station, to a fourth station, and so forth. Rechargeable wafer carrier system 10 may be operable with an existing AMHS in an automated fabrication plant environment.

With reference still to FIG. 1, rechargeable wafer carrier system 10 may be positioned on charging base 800, which may be disposed on load port 621 of station 620, such as a processing station.

With reference to FIG. 2, rechargeable wafer carrier system 10 may generally include housing 20 for holding one or more wafers 80 therein, a rechargeable power source 33 for powering one or more electronics systems (not shown), and a charging interface 210 for receiving a supply of power for charging rechargeable power source 33. Rechargeable power source 33 may include one or more electrical leads 250 that facilitate distribution of power. As will be appreciated, the manner and/or mechanism of power distribution depends on the types of electronics systems that may be used with the rechargeable wafer carrier. Housing 20 may be formed of any suitable material, for instance, polycarbonate material, metallic-based material, or combination thereof. As will be appreciated, the housing may be constructed using metallic-based material, for example, to provide shielding from external electromagnetic interference, lessen the risk of molecular contamination outgassing and cross-contamination between processes, and facilitate cleaning. Housing 20 may be referred to as a wafer carrier or a FOUP. Housing 20 may include any acceptable FOUP, i.e. any FOUP that meets the appropriate standard.

Rechargeable wafer carrier system 10 may include charging interface 210 for receiving a supply of power from charging base 800 for charging power source 33. Power source 33 may be a rechargeable battery, such as, a nickel cadmium (NiCd) battery, a nickel metal hydride (NiMH) battery, a lithium ion (Li-ion) battery, and a lithium ion polymer (Li-ion polymer) battery. In this embodiment, exemplary charging interface 210 may include, for instance, a secondary induction coil 232 for charging power source 33, for example, a rechargeable battery, via inductive charging. Charging base 800 may include a power supply interface having, for instance, an induction projection 812 having a primary induction coil 820 operable to create an alternating electromagnetic field with secondary induction coil 232, which generates an electric current transmittable, for example, via wires 270 (FIG. 4), to charge power source 33. Primary induction coils may be referred to as primary coils and secondary induction coils may be referred to as secondary coils. Induction coils 820, 232, as shown in FIG. 2, may act to form an electrical transformer. For example, a complete electrical transformer may be formed by mating rechargeable wafer carrier system 10 with charging base 800. Secondary induction coil 232 may be disposed on or within housing 20, for example, secondary induction coil 232 may be disposed within housing 20 proximate to bottom wall 24, as shown in this embodiment.

As illustrated in FIGS. 2 and 3, charging interface 210 may include a receptor 211 (FIG. 3) disposed on bottom wall 24. Receptor 211 may be configured to mate with a power supply interface, such as an inductance projection 812 (FIG. 2) on charging base 800. Receptor 211 may be configured to include, for example, a receptacle, an opening, an aperture, a cavity, or any other configuration that allows for mating with the inductance projection 812. Secondary induction coil 232 (FIG. 2) disposed on or within housing 20 may be positioned adjacent to receptor 211. Primary induction coil 820 (FIG. 2) may be, for instance, disposed on or within charging base 800. For instance, primary induction coil 820 (FIG. 2) may be disposed within inductance projection 812. Primary induction coil 820 may be positioned within charging base 800 in any manner that allows for primary induction coil 820 to engage with secondary induction coil 232, for example, when housing 20 is placed on charging base 800 and aligned via projections 811 received in grooves 201 (FIG. 2). In some embodiments, charging interface 210 may be disposed within housing 20 such that inductance projection 812 may be disposed substantially flushed against bottom wall 24 when housing 20 is placed on charging base 800 and aligned via projections 811 received in grooves 201. In some embodiments, charging interface 210 may include a contact member (not shown) disposed on bottom wall 24. Contact member may be any component that may be disposed on the bottom wall of a housing, such that inductance projection 812 may be positioned substantially flushed against the contact member when housing 20 is placed on charging base 800 and aligned via projections 811 received in grooves 201.

In some embodiments, inductance projection 812 may be retractable or extendable, such that when rechargeable wafer carrier system 10 is operably engaged with, for instance, a processing station, inductance projection 812 may extend to mate with receptor 211, bottom wall 24, or inductance projection 812 may retract when the rechargeable wafer carrier system is not operably engaged.

With reference to FIG. 3, housing 20 may include one or more alignment interfaces 220 located on an outer wall, for example, bottom wall 24, that are configured to mate with a corresponding number of projections, for example, alignment projections 811, on charging base 800. One or more alignment interfaces 220 may include, for example, grooves 201 that may receive and mate with alignment projections 811. One skilled in the art is familiar with the alignment and mating of a FOUP, for instance, the alignment of projections with grooves to achieve six-points of final contact for kinematic coupling. As will be appreciated, when housing 20 is mated to charging base 800 via alignment of projections 811 in grooves 201, primary induction coil 820 (FIG. 2) is proximate to secondary induction coil 232 (FIG. 2) to allow primary induction coil 820 to engage with secondary induction coil 232.

Figure 4:
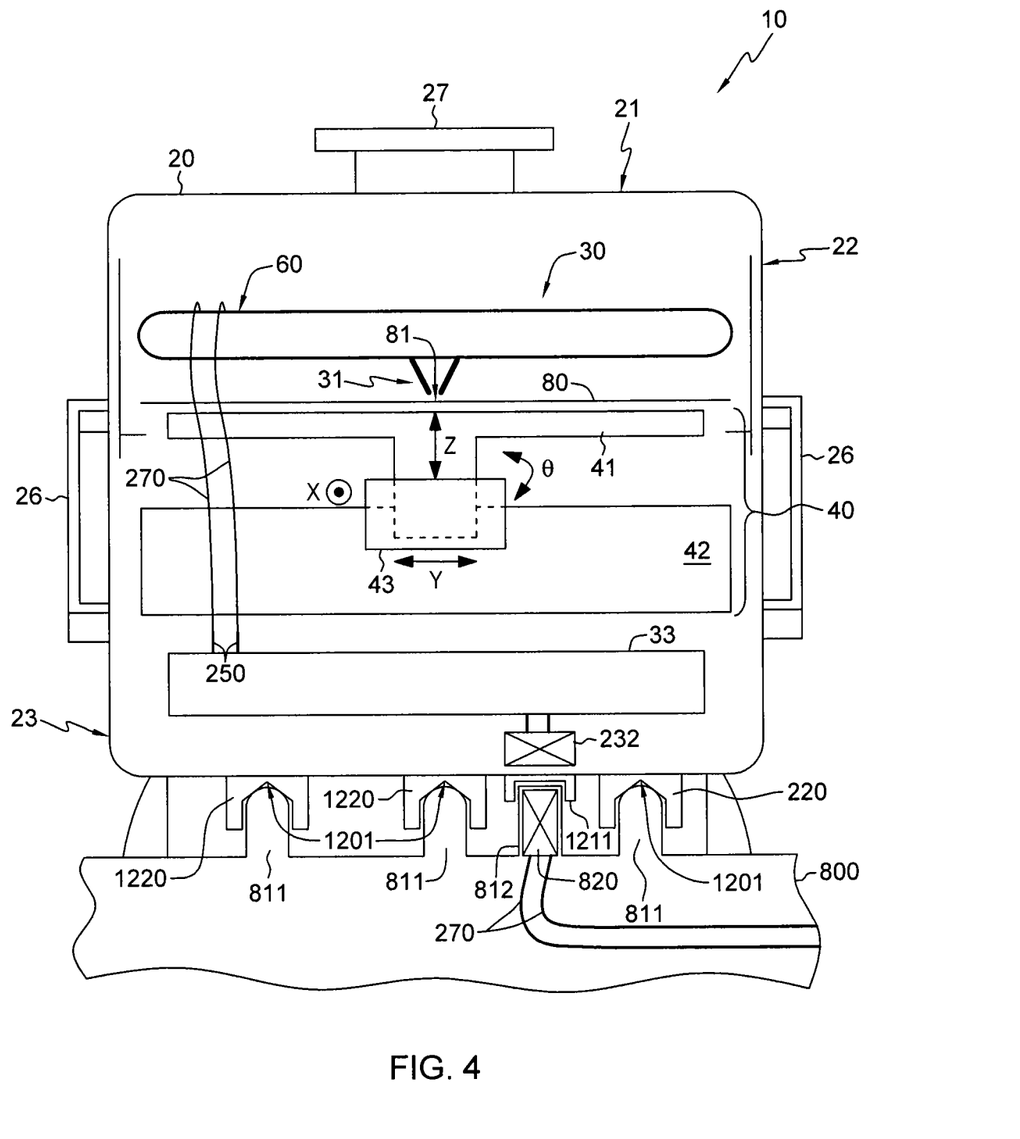
FIG. 4 is an elevational view, in part cross-section, of a rechargeable wafer carrier system and a portion of charging base according to an embodiment of the present disclosure.

As shown in the embodiment in FIG. 4, rechargeable wafer carrier system 10 may also include an electronics system 30 disposed within housing 20 that may be connected to rechargeable power source 33 by, for instance, electrical leads 250 and wires 270. Electronics system 30 may include, for instance, one or more metrology systems, sensors, cameras, communication devices, or any electronic device that requires power. For instance, where electronics system 30 is a metrology system, the metrology system may include a metrology tool or enclosure 60 disposed within housing 20. Enclosure 60 is not limited to a box-like configuration and may be any structure that allows for one or more components of metrology system to be secured onto it for measuring one or more characteristic of wafer 80. For instance, metrology tool or enclosure 60 may be a wholly enclosed structure or may be a supporting frame, such as a chassis.

Rechargeable wafer carrier system 10 may also include a support 40 for supporting wafer 80 in housing 20. Support 40 may be any structure that holds a wafer in place within housing 20 for measurement. For example, support 40 may include, for example, a platform 41 and a base 42. Base 42 may be operably connected to the bottom of platform 41. Base 42 may also be operably connected to the side of platform 41 (not shown). Platform 41 may be referred to as, for example, a chuck, and base 42 may be referred to as, for example, a stage. The platform, i.e. the chuck, may provide a surface for the placement of wafer 80 being measured. The base, i.e. stage, may be positioned below the platform and may include a micro z-motion motor 43 to provide z-motion in the direction of double headed arrow Z to the platform and to the wafer being measured. The platform, in one embodiment, translates in the Z-direction toward metrology system 30 to move wafer 80 towards the metrology system to allow for measurement of wafer 80. The motor may be connected to a mechanism which allows platform 41 and base 42 to move relative to one another so as to move wafer 80 towards and away from metrology system 30. Suitable mechanism may include linear screws or any other suitable mechanism. The base 42 may include other micro motion motors, for instance, a micro x-motion motor, a micro y-motion motor, and/or a micro θ-motion motor to provide x-motion in the forward and backward, as depicted by the solid circle within a circle X, y-motion in the direction of double headed arrow Y, and/or θ-motion in the direction of double headed curved arrow θ, relative to the platform and to the wafer being measured, respectively. The platform and the base may be made of any suitable material, for example, the same materials used for the housing. Other supports for supporting one or more wafers may include brackets, or other supports attached to the inner sidewalls of the housing. The above detailed components may be mounted or otherwise secured to housing 20.

Electronics system 30, for example, a metrology system, may include enclosure 60 within housing 20, and may include in this embodiment, one or more sensing units 31 as described in greater detail below. Metrology system may be, for instance, a metrology tool or equipment, for example, an ellipsometer, an optical camera, a reflectometer, or a pyrometer. Metrology system disposed in rechargeable wafer carrier system 10 may be any metrology instrument or measurement tool for measuring one or more characteristics of a wafer. The one or more characteristics of a wafer measured may include film thickness, film temperature, distribution of heat on the wafer, film composition, electrical conductivity, reflectivity of a surface of the wafer, film optical constants, optical images, surface roughness, wafer topography, wafer bow, defects on the wafer surface, number of particles on the wafer surface, other characteristics, and the like.

Figure 5:
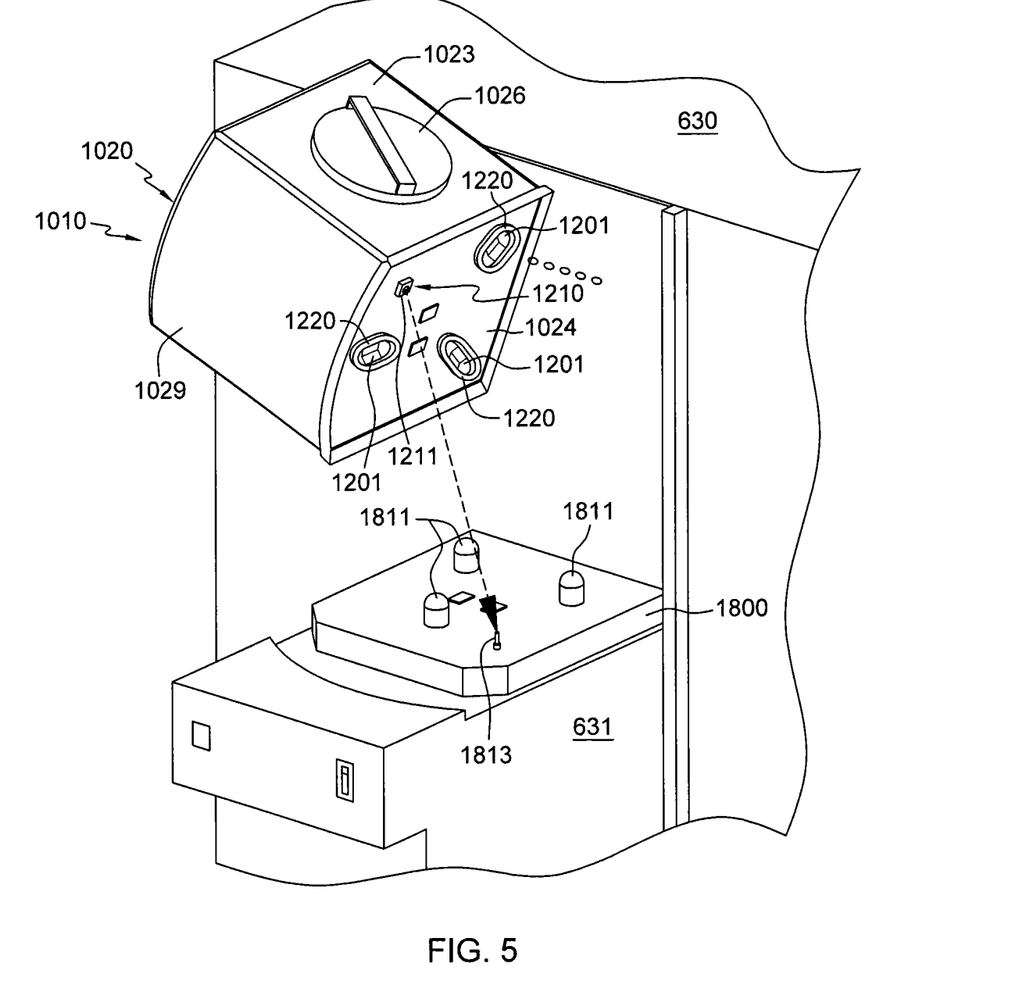
FIG. 5 is a perspective view of a rechargeable wafer carrier system and a portion of a processing station with a charging base according to an embodiment of the present disclosure.

FIG. 5 illustrates a rechargeable wafer carrier system 1010 according to an embodiment of the present disclosure. Rechargeable wafer carrier system 1010 may have a housing 1020 having a top wall (not shown), side walls 1022 and 1023, a bottom wall 1024, a rear wall 1029, and a front wall (not shown), which may also be referred to as a front door. Housing 1020 may also include an adaptor (not shown) and handles 1026 (only one of which is shown in FIG. 5) for use with or engageable with an automated transport system, for example, an automated material handling system (AMHS), or robots. Housing 1020 may include additional features that allow it to function in an automated fabrication plant. Rechargeable wafer carrier system 1010 may be essentially the same as rechargeable wafer carrier system 10 (FIGS. 1-3) with the exception that rechargeable wafer carrier system 1010 may include a different charging interface, a different power supply interface, and may include one or more electronics system. For instance, rechargeable wafer carrier system 1010 may include a charging interface 1210 having an electrical receptor 1211 receivable and matable with a power supply interface, for example, an electrical plug 1813 disposed on a charging base 1800.

With reference still to FIG. 5, housing 1020 may also have one or more alignment interfaces 1220 positioned on bottom wall 1024 that are configured to mate with a corresponding number of projections, for example, alignment projections 1811, on charging base 1800. One or more alignment interfaces 1220 may include, for example, grooves 1201 that may receive and mate with alignment projections 1811. As will be appreciated, when housing 1020 is mated to charging base 1800 via alignment projections 1811 in grooves 1201, electrical receptor 1211 and electrical plug 1813 are mated. Alignment projections 1811 may be any protrusion that mate with grooves 1201, for instance, a bump, a stub, a block, a stump, and the like. In the embodiment represented in FIG. 5, for example, alignment interface 1210 may have three grooves 1201 that align with three alignment projections 1811 on charging base 1800 disposed on a load port 631 of, for instance, a processing station 630. Charging interface 1210 may include electrical receptor 1211, which is receivable and matable with electrical plug 1813, such that housing 1020 is mated to charging base 1800 to form an electrical connection to supply power to the power source. Electrical plug 1813, for example, may be a direct current (DC) connector, DC plug, or the like. Electrical plug 1813 may be any protrusion that mates with electrical receptor 1211, for instance, a nib, a pin, a jack, and the like. In some embodiments, the electrical receptor and electrical plug may include positive and negative terminals. In other embodiments, two spaced-apart separate mating, engageable electrical receptors and electrical plugs may be employed, with one forming a positive voltage connection and the other a negative voltage or ground connection. In some embodiments, an electrical plug may be retractable or extendable, such that when a rechargeable wafer carrier system is operably engaged with, for instance, a processing station, an electrical plug may extend to mate with an electrical receptor, and may retract when the rechargeable wafer carrier system is not operably engaged. While a charging base may provide a direct current applied to an electrical plug, it will be appreciated that an alternating current may be supplied to an electrical plug and the rechargeable electric wafer carrier system may include a transformer for converting the alternating current to direct current for charging a rechargeable battery in the rechargeable electric wafer carrier system.

Figure 6:
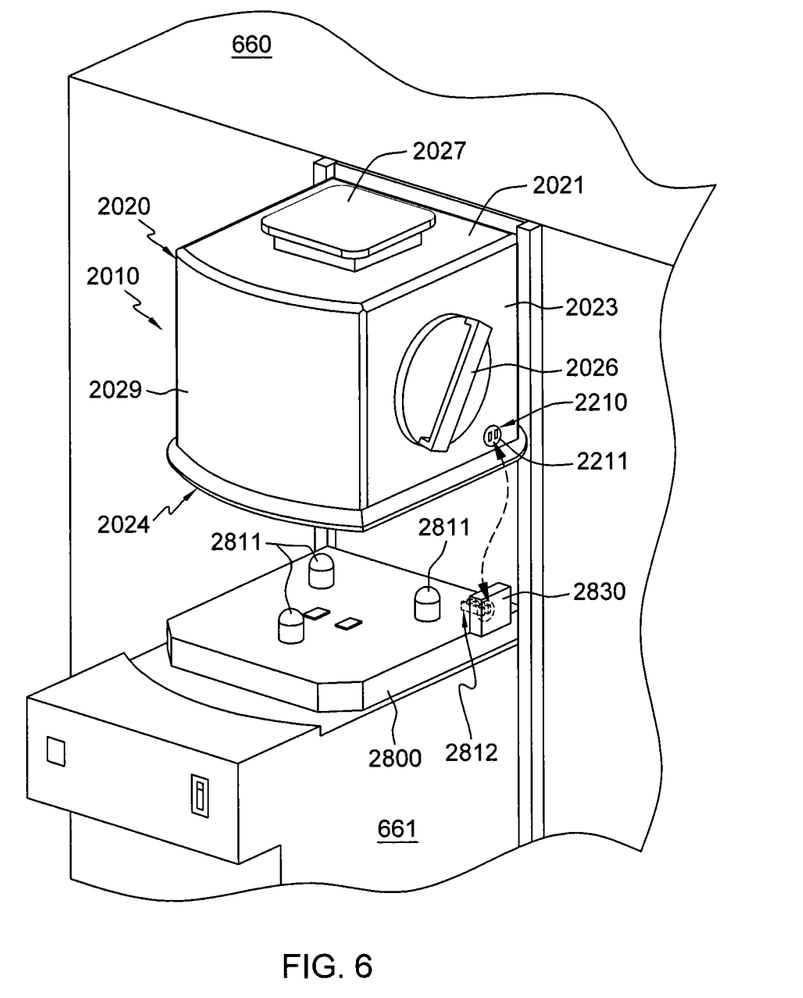
FIG. 6 is a perspective view of a rechargeable wafer carrier system and a portion of a processing station with a charging base according to an embodiment of the present disclosure.

FIG. 6 illustrates a rechargeable wafer carrier system 2010 according to an embodiment of the present disclosure. Rechargeable wafer carrier system 2010 may have a housing 2020 having a top wall 2021, side walls 2022 and 2023, a bottom wall (not shown), a rear wall 2029, and a front wall (not shown), which may also be referred to as a front door. Housing 2020 may also include an adaptor 2027 and handles 2026 (only one of which is shown in FIG. 6) for use with or engageable with an automated transport system, for example, an AMHS, or robots. Housing 2020 may include additional features that allow it to function in an automated fabrication plant.

Rechargeable wafer carrier system 2010 may be essentially the same as rechargeable wafer carrier system 10 (FIGS. 1-3) with the exception that rechargeable wafer carrier system 2010 may include a different charging interface and power supply interface. For instance, in this embodiment, rechargeable wafer carrier system 2010 may include a charging interface 2210 configured to align with a charging block 2830 of a charging base 2800. Housing 2020 may include one or more alignment interfaces 2220 located on an outer wall, for example, bottom wall 2024, that are configured to mate with a corresponding number of projections, for example, alignment projections 2811, on charging base 2800. One or more alignment interfaces 2220 may include, for example, grooves (not shown) that may receive and mate with alignment projections 2811. As will be appreciated, when housing 2020 is mated to charging base 2800 via alignment projections 2811 in grooves, charging interface 2210 may align with a charging block 2830.

With reference still to FIG. 6, housing 2020 may include charging interface 2210 for receiving a supply of power to charge a power source (not shown). For instance, the power source of this embodiment may be charged via inductive charging, as described above. Charging interface 2210 may include, for example, a secondary coil configured to align with charging block 2830 disposed on charging base 2800. Charging interface 2210 may include a receptor 2211. Receptor 2211 may be, for example, an opening, an aperture, a receptacle, or any other shape that allows for mating with an inductance projection 2812. When receptor 2211 mates with inductance projection 2812 disposed on charging block 2830, the secondary coil (not shown) disposed within housing 2820 adjacent receptor 2211, interacts with a primary coil (not shown) disposed in inductance projection 2812 of charging block 2830. Inductance projection 2812 may be retractable and/or extendable, such that when rechargeable wafer carrier system 2010 is not detected, inductance projection 2812 may be in a retracted state, and when rechargeable wafer carrier system 2810 is detected, inductance projection 2812 may extend to mate with receptor 2211. Inductance projection 2812 may be of any configuration that allows it to mate with receptor 2211 to establish an electrical connection, for instance, a single-pronged projection having two or more contacts, such as an USB connector, or power interface of mobile devices.

In other embodiments, a charging block may include retractable electrical contact(s) that engage a rechargeable wafer carrier system. In this embodiment, the configuration of a rechargeable wafer carrier system may be similar to the embodiment illustrated in FIG. 6. A housing may also include a charging interface, similar to charging interface 2210 (FIG. 6) for receiving a supply of power to charge the power source. The charging interface may have one or more grooves positioned on a bottom wall of a housing that align with a corresponding number of alignment projections on a charging base. The charging interface may also include, for example, an electrical receptor configured to align with a charging block disposed on a charging base. When the electrical receptor mates with an electrical projection disposed on the charging block, an electrical connection is formed. In some embodiments, electrical projection may be retractable or extendable, such that when the rechargeable wafer carrier system is operably engaged with, for instance, a processing station, electrical projection may extend to mate with the electrical receptor, and may retract when the rechargeable wafer carrier system is not operably engaged.

Figure 7:
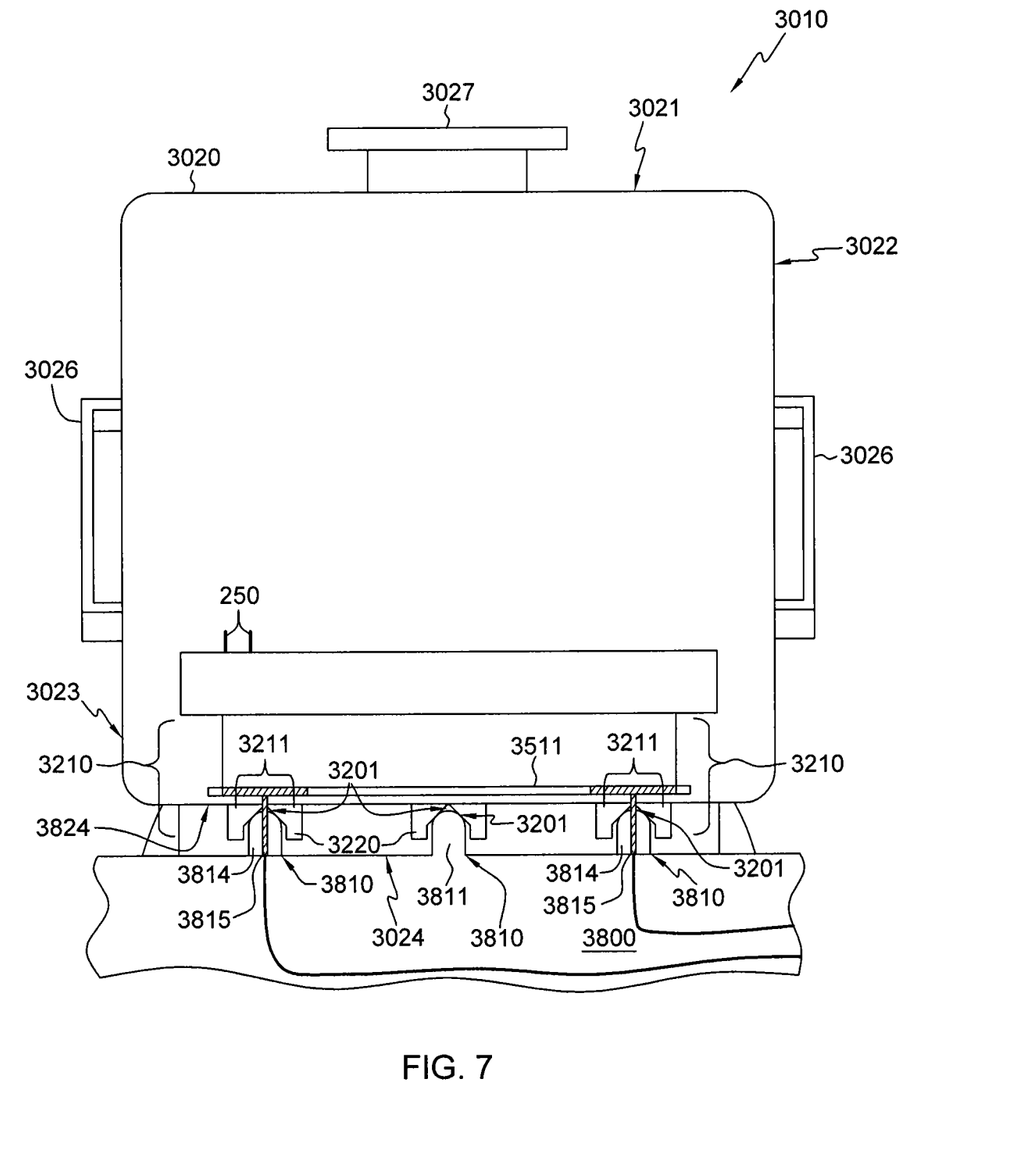
FIG. 7 is an elevational view, in part cross-section, of a rechargeable wafer carrier system and a portion of a charging base according to an embodiment of the present disclosure.

FIG. 7 illustrates a rechargeable wafer carrier system 3010 according to an embodiment of the present disclosure. Rechargeable wafer carrier system 3010 may have a housing 3020 having a top wall 3021, side walls 3022 and 3023, a bottom wall 3024, a rear wall (not shown), and a front wall (not shown), which may also be referred to as a front door. Housing 3020 may also include an adaptor 3027 and handles 3026 for use with or engageable with an automated transport system, for example, an automated material handling system (AMHS), or robots. Housing 3020 may include additional features that allow it to function in an automated fabrication plant.

Rechargeable wafer carrier system 3010 may be essentially the same as rechargeable wafer carrier system 10 (FIGS. 1-3) with the exception that rechargeable wafer carrier system 3010 may include a different charging interface and power supply interface. For instance, rechargeable wafer carrier system 3010 may include one or more alignment interfaces 3220 located on an outer wall, for example, bottom wall 3024, that are configured to mate with a corresponding number of projections 3810 on charging base 3800. Charging interface 3210 having one or more alignment interfaces 3220 may include a power supply interface, for instance, an electrical receptor 3211, a charging interface 3210 having one or more electrical receptors 3211 configured to establish electrical connection with one or more multi-purpose projections 3814. One or more alignment interfaces 3220 may include, for example, grooves 3201 that may receive and mate with corresponding number of projections 3810. One or more projections 3810 of this embodiment may be, for instance, an alignment projection 3811. One or more projections 3810 of this embodiment may be, for instance, a multi-purpose projection 3814 that may be both an alignment projection and an electrical projection. Multi-purpose projection 3814 may also include an electrical contact 3815, for instance, a metal pin or jack, disposed within one or more multi-purpose projection 3814 that may be extendable. For instance, when rechargeable wafer carrier system 3010 is operably engaged with, for instance, a processing station, electrical contacts 3815, i.e. metal jacks, within the multi-purpose projections 3814 may extend to touch one or more electrical receptor 3211, to operably engage a power distribution system, such as, for example, a strip 3511 having electrically positive portions, such as metal portions, to establish an electrical connection. As will be appreciated, the strip may be any component or device operable for power delivery and may include, for instance, electrically positive, negative, and/or ground portions. As will also be appreciated, when alignment interfaces 3220 are mated to projections 3810, for example, one or more multi-purpose projection 3814, electrical connection may be made to supply power to rechargeable power source 33.

In some embodiments, an electronics system according to the present disclosure may be, for instance, a metrology system. The metrology system may be, for instance, a metrology tool or equipment, for example, an ellipsometer. The metrology system may include a sensor or sensing unit such as an optical system, a computer or computing unit connected to the sensing unit, and a power source (such as power source 33 (FIG. 4)) that powers the computing unit and the sensing unit. The computing unit may be a computing system or other computing device that includes any appropriate hardware component(s) capable of implementing functions, as described in greater detail below. The metrology system may also include a network adaptor for communication of data between the computing unit and another component, such as another computing unit or computer system, across communication links. The network adaptor may be, for instance, a transmitter, and may be capable of sending and receiving data and control commands. For instance, after measuring one or more characteristics of a wafer, the measurement data may be transmitted, for example, wirelessly to a remote computer. Transmission of measurement data is not limited to wireless transmission and may be transmitted in any conventional manner. For instance, rechargeable wafer carrier system 10 (FIG. 1) may be, for example, docked at a station for transfer of data. The network adaptor may be a part of the computing unit, for example, as an integrated component of the computing unit such as a network interface card (NIC) or a wireless NIC, or may be operably connected to the computing unit.

The metrology system may also include additional components, such as wiring and standard connectors and fittings for the operations and functions of the metrology system, which will be apparent to one skilled in the arts. The metrology system may be assembled in any operable manner, for instance, without requiring any particular alignment or layout using, for example, appropriate connectors, adaptors, and/or wiring. While the power source and network adaptor may be within the enclosure, it will be appreciated that the power source and network adaptor may independently be disposed outside the enclosure but within the housing of the rechargeable wafer carrier system, and operably connected or connectable to the computing unit. The power source may be, for example, a rechargeable battery, as detailed above.

One embodiment of a sensing unit of a metrology system according to the present disclosure may include, for example, an emitting portion and a collecting portion. The emitting portion may include an emitter such as a laser connected to a polarizer, with the polarizer connected to a focuser. The collecting portion may include a detector connected to an analyzer, with the analyzer connected to a lens collector. As will be appreciated and understood by one skilled in the art, a laser light may be polarized by a polarizer, such that the laser light is emitted in a specific and known polarized state when emitted onto a sample. In other words, the polarizer sets the polarization of the light such that the polarization of the light is known when the light hits the sample. The focuser may focus the light. A collector may be considered a counterpart to the focuser, where light reflected off of the sample is collected by the collector. In other words, the collector may be identical in form to the focuser, but instead of emitting light, the collector collects the light. The collected light passes through another polarizer, which is referred to as an analyzer when collected light passes through it. The analyzer may be rotated to determine and map the polarization state of the reflected, i.e. collected, light. A detector may detect the intensity of the reflected light and the intensity may vary as a function of the angle of the analyzer. The above components of the sensing unit may be connected using, for example, optical fibers. The metrology system may measure, for instance, one or more characteristics of a wafer at one or more point, region, or location on the wafer. For instance, a single metrology system may be included in the rechargeable wafer carrier system, for instance, secured to the housing, and measure a point, a region, or a location on the wafer. The measurement may be taken at any point, region, or location on the wafer as needed or desired by, for instance, positioning the focuser and the lens collector over the portion of the wafer, i.e. the point, region, or location on the wafer, where measurement will be taken. The portion of the wafer corresponding to the tips of the focuser and the lens collector may be referred to as measurement point.

In some embodiments, a rechargeable wafer carrier system according to the present disclosure may include a metrology system operable to measure multiple measurement points on a wafer. The measurement point may include the same or similar characteristics as described above, and may be similar to a measurement point, such as measurement point 81 (FIG. 4). The metrology system may include a sensing unit having, for example, an emitting portion, a collecting portion, and a multiplexer. The emitting portion may include, for example, an emitter such as a laser connected to a polarizer that is connected to the multiplexer. The collecting portion may include, for example, a detector connected to an analyzer that is connected to the multiplexer. The multiplexer may be a device, for instance, that selects one or more paths to forward an input signal from the emitting portion to the wafer. The multiplexer may also be a device, for instance, that selects one or more paths from the output signal from the wafer and forwards it to the collecting portion. The multiplexer may allow, for example, multiple paths, e.g. the pairs of focusers and lens collectors, to share one set of the emitting portion and one set of the collecting portion. One or more pairs of the focuser and the lens collector may be operable for measuring one or more characteristics of the wafer at the measuring points.

The metrology system may also include a computing unit operably connected to a sensing unit, and to a power source (such as power source 33 (FIG. 4)) that powers the computing unit and the sensing unit. The computing unit may include the same or similar characteristics as the computing unit described above. The metrology system may also include a network adaptor capable of sending and receiving data and control commands. For instance, after measuring one or more characteristics of a wafer, the measurement data may be transmitted, for example, wirelessly to a remote computer. As described above, transmission of measurement data is not limited to wireless transmission and may be transmitted in any conventional manner. The network adaptor may be a part of computing unit, for example, as an integrated component of the computing unit, or may be operably connected to the computing unit. The power source may be, for example, a rechargeable battery, as detailed above.

One or more characteristics of a wafer may be measured at one or more measurements points on the wafer. For instance, multiple measurements may be taken on various portions of the wafer. Measurement points may be on any portion of the wafer, depending on the pattern or the number of measurements desired to be obtained, and is not limited to any particular pattern or number of measurements.

In some embodiments, a rechargeable wafer carrier system according to the present disclosure may include a metrology system that may be, for instance, a metrology instrument such as a pyrometer. The metrology system may be disposed within an enclosure, which may be a wholly enclosed structure or may be a supporting frame, such as a chassis. The metrology system may include a sensing unit, a computing unit connected to the sensing unit, and a power source (such as power source 33 (FIG. 4)) that powers the computing unit and the sensing unit. The computing unit of this embodiment may include the same or similar characteristics as the computing unit described above. The metrology system may also include a network adaptor capable of sending and receiving data and control commands. For instance, after measuring one or more characteristics of a wafer, the measurement data may be transmitted, for example, wirelessly to a remote computer. As described above, the transmission of measurement data is not limited to wireless transmission and may be transmitted in any conventional manner. As also described above, the network adaptor may be a part of the computing unit, for example, as an integrated component of the computing unit, or may be operably connected to the computing unit. The power source may be, for example, a rechargeable battery, as detailed above. The metrology system may also include additional electronic components, which will be apparent to one skilled in the arts. The sensing unit may include, for example, a multiplexer and one or more probes connected to the multiplexer by, for instance, electrical wires. In other embodiments (not shown), the sensing unit may include a single probe, for example, an infrared camera with a wide angle lens to cover the entire wafer. In other embodiments, the metrology system may include an ellipsometer, optical camera, and/or reflectometer. With the use of a pyrometer, ellipsometer, optical camera, and/or reflectometer in a metrology system, film thickness, film temperature distribution of heat on the wafer, film composition, conductivity and reflectivity of the wafer surface, film optical constants, optical images, surface roughness, wafer topography, wafer bow, defects on the wafer surface, and the number of particles on the wafer surface, may be measured.

The computing unit that may be used in the embodiments of rechargeable wafer carrier system(s) according to the present disclosure, may include one or more processors, memory, and one or more input/output (I/O) devices, which may be coupled to each other by busses and other electrical hardware elements. The computing unit may be, for example, a compact, fanless device. Processor(s) may include any appropriate hardware component(s) capable of implementing functions, for instance executing instruction(s) (sometimes alternatively referred to as code, firmware and/or software) retrieved from memory. Memory may include hardware components or other storage devices to store data, such as programs of instructions for execution, and other data. I/O devices may include hardware and/or software components that support input and output of data to/from the computing unit. I/O devices may include physical components that attach physically or wireless to the computing unit and/or integrate into the computing unit, for example, display devices, gyroscopes, light sensors, proximity sensors, and accelerometers. I/O devices may also include, for example, communications links for passing data packets between the computing unit and other systems (e.g. remote computer) across one or more networks, such as the Internet or intranet. Other examples of I/O devices may include universal serial bus (USB), peripheral component interconnect (PCI), and serial adapters/interfaces configured to couple to devices of their respective kind.

In the rechargeable wafer carrier system of the present disclosure, a rechargeable power source may be a rechargeable battery. A suitable rechargeable battery may include, a nickel cadmium (NiCd) battery, a nickel metal hydride (NIMH) battery, a lithium ion (Li-ion) battery, and a lithium ion polymer (Li-ion polymer) battery. Other rechargeable power sources may be a capacitor, such as a supercapacitor or an ultra-capacitor. It will be appreciated that other rechargeable power sources and other charging interfaces, including wireless devices and mechanisms, may be suitably employed. As will be appreciated, the rechargeable power source of the present disclosure may be charged by any suitable method, for instance, via wireless charging, inductive charging, conductive charging, electrical contacts, and so forth.

Figure 8:
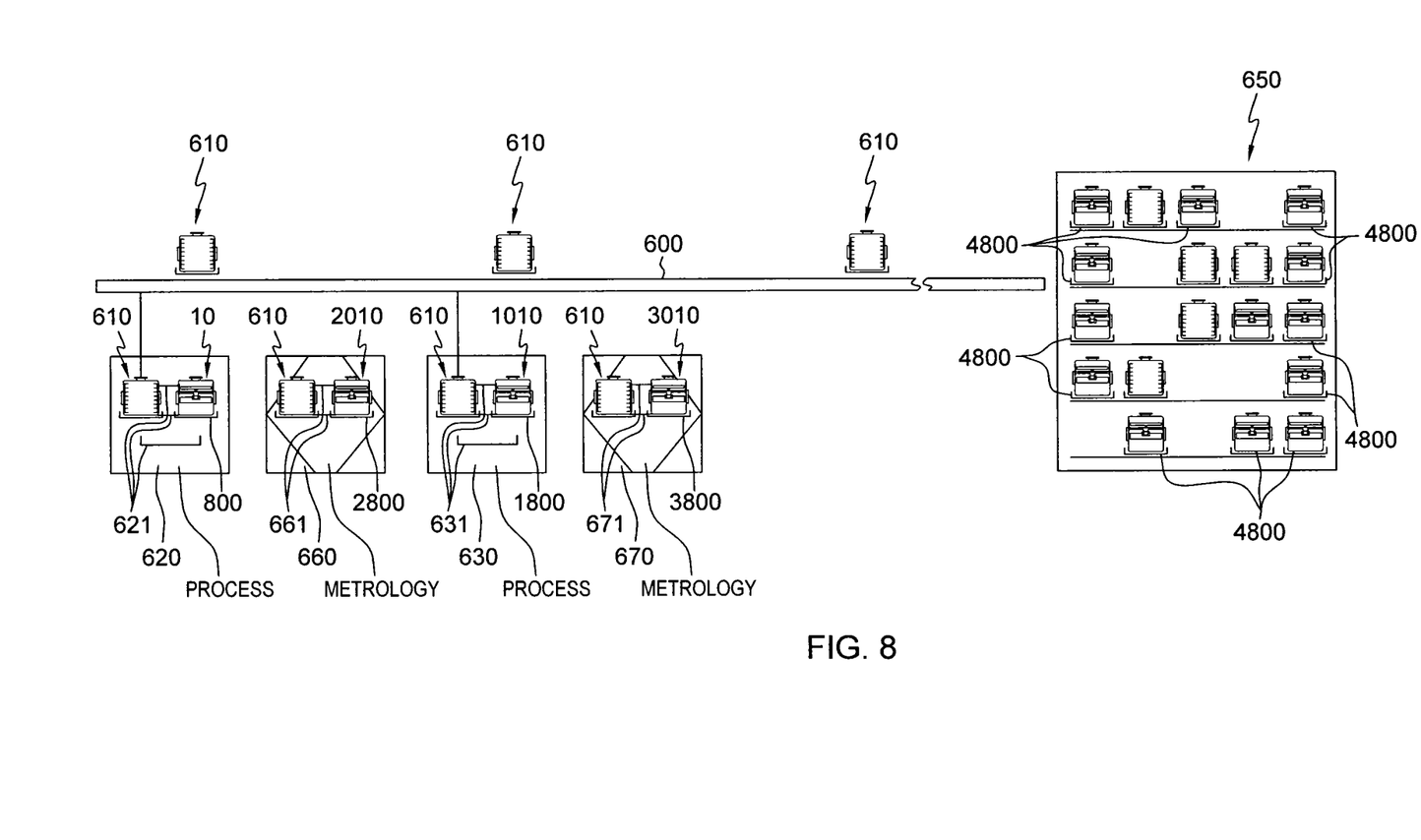
FIG. 8 is a schematic illustration of an automated fabrication plant having a plurality of rechargeable wafer carrier systems according to an embodiment of the present disclosure.

FIG. 8 depicts a schematic illustration of rechargeable wafer carrier systems, such as rechargeable wafer carrier system 10 (FIGS. 1-4), 1010 (FIG. 5), 2010 (FIG. 6), and/or 3010 (FIG. 7), in use in an automated fabrication plant with an AMHS 600, according to one or more embodiments of the present disclosure. The rechargeable wafer carrier systems, for example, rechargeable wafer carrier system 10, may be mounted on a charging base 800 on a load port 621 of a processing station 620, while rechargeable wafer carrier system 2010 may be mounted on a charging base 2800 on a load port 661 of a metrology station 660, rechargeable wafer carrier system 1010 may be mounted on a charging base 1800 on a load port 631 of a processing station 630, and so forth. Standard FOUPs 610, i.e. a semiconductor wafer carrier that does not include an electronics system or a rechargeable battery, may be mounted on the charging bases, such as charging base 800, 1800, 2800, and/or 3800, or directly onto the load ports. For instance, FOUP 610 may be positioned on load port 621 next to rechargeable wafer carrier system 10, on load port 661 next to rechargeable wafer carrier system 2010, on load port 631 next to rechargeable wafer carrier system 1010, and so forth. Rechargeable wafer carrier systems according to the present disclosure may also be positioned on one or more charging bases 4800 located in a storage unit 650, also referred to as a stocker. For instance, after processing at the processing station 620, wafer(s) may be moved, for example, by an automated tool or robot into rechargeable wafer carrier system 10 having the electronics system to measure one or more characteristics of one or more wafers, for example, while rechargeable wafer carrier system 10 remains mounted on load port 621. After being measured, wafer(s) may be moved by, for example, an automated tool or robot back into standard FOUP 610, for example, for transporting to another processing station, such as a processing station 630, or storage unit 650.

In some embodiments, where an electronics system is a metrology instrument, wafer(s) may remain in a rechargeable wafer carrier system, such as rechargeable wafer carrier system 10, 1010, 2010, and 3010, and be measured while being transported to another location, such as a processing station 630, an another processing station (not shown), or a storage unit 650, or while awaiting an action, for instance, while on load port 631 of the processing station 630 prior to processing at the processing station 630, or while in the storage unit 650.

As will be appreciated, rechargeable wafer carrier systems may be charged at various locations within a semiconductor fabrication plant where a charging base may be installed or mounted, for example, on load ports of stations, such as processing stations, and metrology stations, charging stations, in stockers, and so forth. For instance, rechargeable wafer carrier system 10 having a metrology system may remain on load port 621 and a power source associated with rechargeable wafer carrier system 10 may be charged in accordance with one or more embodiments of the present disclosure, such as, via inductive charging. Rechargeable wafer carrier systems may also be charged while being transported to another location, for example, while being transported by AMHS 600.

Thus, in accordance with the present disclosure, a rechargeable wafer carrier system, such as rechargeable wafer carrier system 10, 1010, 2010, and 3010, may be located at various different locations within the AMHS and/or a fabrication plant. In some embodiments, a rechargeable wafer carrier system may measure one or more characteristics of the wafers contained therein. For example, a rechargeable wafer carrier system may be located adjacent a processing station, which performs a first process on one or more semiconductor wafers within rechargeable wafer carrier system. The rechargeable wafer carrier system may also be disposed on a load port of the processing station, or otherwise located proximate to the processing station. After such process, the wafer may be moved into the rechargeable wafer carrier system wherein one or more characteristics of the wafer may be measured. The characteristic may include film thickness, film temperature, heat distribution on the wafer, film composition, electrical conductivity, film optical constants, optical images, surface roughness, wafer topography, wafer bow, defects on the wafer surface, number of particles on the wafer surface, and/or reflectivity on the surface of the wafer. Each of these measurements may be conducted by a separate rechargeable wafer carrier system with a metrology system therein. Accordingly, depending upon the characteristics measured, either one or multiple rechargeable wafer carrier systems may be located adjacent the processing station. Similarly, adjacent another process station, another rechargeable wafer carrier system may be used. The rechargeable wafer carrier systems near the other process station may be also capable of measuring one or more of the aforementioned characteristics. Each rechargeable wafer carrier system may be capable of measuring one or multiple of the aforementioned characteristics. Similarly, the rechargeable electronic wafer carrier system may be located at other processing stations within the AMHS.

Accordingly, in embodiments of the present disclosure, an automated material handling system for an automated semiconductor fabrication facility include rechargeable wafer carrier systems, such as rechargeable wafer carrier system 10, 1010, 2010, and 3010, as described previously herein. Such rechargeable wafer carrier systems may be located at various locations along the semiconductor wafer automated material handling system either adjacent individual stations, namely, on processing stations, before processing stations or after processing stations, as well as along transport lines between processing stations, and at storage locations for semiconductor wafers.

Figure 9:
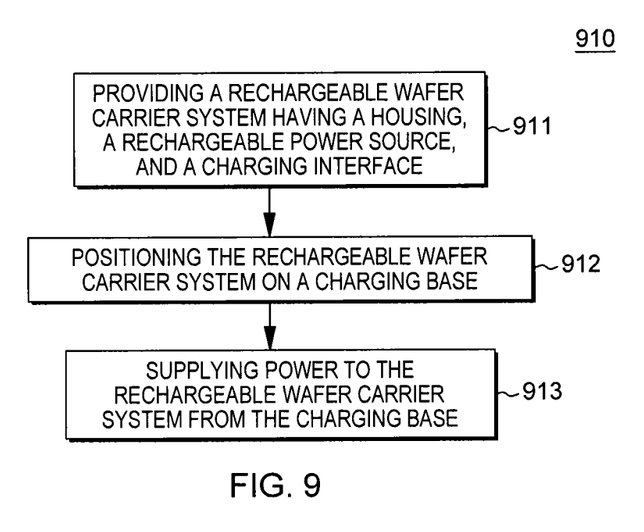
FIG. 9 is a flowchart of a method for charging a rechargeable wafer carrier system according to an embodiment of the present disclosure.

With reference to FIG. 9, a method 910 according to an embodiment of the present disclosure for charging a power source contained within a rechargeable wafer carrier system is provided. The method includes, for instance, at 911 providing a rechargeable wafer carrier system as described above, having a housing, a rechargeable power source, and a charging interface, at 912 positioning the rechargeable wafer carrier system on a charging base, and at 913 supplying power from the charging base to the rechargeable wafer carrier system.

Figure 10:
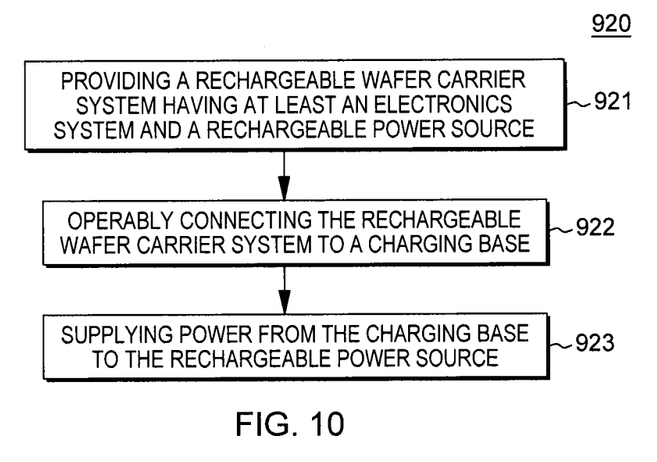
FIG. 10 is a flowchart of a method for charging a rechargeable wafer carrier system according to an embodiment of the present disclosure.

With reference to FIG. 10, a method 920 according to an embodiment of the present disclosure for charging a power source contained within a rechargeable wafer carrier system is provided. The method includes, for instance, at 921 providing a rechargeable wafer carrier system having at least one electronics system and a rechargeable power source, at 922 operably connecting the rechargeable wafer carrier system to a charging base, and at 923 supplying power from the charging base to the rechargeable power source. Operably connecting the rechargeable wafer carrier system to the charging base may create an electrical connection. The rechargeable wafer carrier system of the method may further include an electronics system.

As will be appreciated, the rechargeable wafer carrier systems of the present disclosure will not be disruptive to the AMHS implemented in any existing fab environment and may improve overall efficiency of manufacturing semiconductor devices. For instance, where rechargeable wafer carrier systems have metrology instruments contained therein, cycle times may be beneficially reduced by, for instance, moving wafers directly from one processing station to the next processing station, rather than transporting wafers to metrology stations after a processing step. Another benefit may be realized by performing metrology on wafers shortly after processing. Costs may also be reduced, for instance, as multiple, expensive metrology tools may not be necessary and as a result, such tools need not be occupying any cleanroom space. Additionally, the components of the rechargeable wafer carrier systems are relatively inexpensive and maximize the use of automated systems to reduce labor costs. Efficiency may also be improved as the rechargeable wafer carrier systems need not be sent to separate charging stations.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of one or more aspects of the disclosure and the practical application, and to enable others of ordinary skill in the art to understand one or more aspects of the disclosure for various embodiments with various modifications as are suited to the particular use contemplated.

The invention claimed is:

1. A wafer carrier system for an automated material handling system to a plurality of stations, the wafer carrier system comprising:
   a front opening unified pod configured to be engaged with the automated material handling system for transport within the automated material handling system to the plurality of stations;
   a metrology system within the front opening unified pod, the metrology system including a sensing unit configured to measure at least one characteristic of a wafer;
   a support disposed within the front opening unified pod, the support configured to hold and move the wafer relative to the sensing unit;
   a rechargeable power source disposed within the front opening unified pod, the rechargeable power source configured to power the sensing unit; and
   a charging interface disposed within the front opening unified pod, the charging interface including a first coil configured to receive a supply of power for charging the rechargeable power source.

2. The wafer carrier system of claim 1 wherein a portion of the charging interface is disposed on a wall of the front opening unified pod.

3. The wafer carrier system of claim 1 further comprising:
   a charging base including a second coil disposed outside of the front opening unified pod, the second coil configured to provide the supply of power to the first coil of the charging interface.

4. The wafer carrier system of claim 3 wherein the charging base comprises a power supply interface operable with the charging interface.

5. The wafer carrier system of claim 3 further comprising:
   at least one alignment interface for aligning the front opening unified pod and the charging interface with the charging base.

6. The wafer carrier system of claim 5 wherein the at least one alignment interface further comprises a power supply interface operable with the charging interface.

7. The wafer carrier system of claim 1 further comprising: a network adaptor operably connected to the sensing unit.

8. The wafer carrier system of claim 4 wherein the power supply interface is movably connectable to the charging interface.

9. The wafer carrier system of claim 1 further comprising:
   a wireless transmitter for transmitting the at least one characteristic of the wafer to a communication network.

10. The wafer carrier system of claim 1 wherein the sensing unit is an ellipsometer, a reflectometer, or a pyrometer.

11. The wafer carrier system of claim 1 wherein the sensing unit includes an emitting portion, a collecting portion, and a multiplexer operably connected to the emitting portion and the collecting portion.

12. The wafer carrier system of claim 11 wherein the emitting portion includes a laser, a polarizer operably connected to the laser, and a focuser operably connected to the polarizer.

13. The wafer carrier system of claim 11 wherein the collecting portion includes a detector, an analyzer operably connected to the detector, and a lens collector operably connected to the analyzer.

14. A method comprising:
providing a front opening unified pod having a metrology system including a sensing unit, a charging interface with a first coil, and a rechargeable power source;
engaging the front opening unified pod with an automated material handling system;
transporting the front opening unified pod within the automated material handling system to a plurality of stations;
holding a wafer on a wafer support disposed inside the front opening unified pod;
moving the wafer support to position the wafer held by the wafer support relative to the sensing unit
measuring one or more characteristics of the wafer with the sensing unit
operably connecting the charging interface to a charging base having a second coil disposed outside of the front opening unified pod; and
supplying power from the second coil of the charging base to the first coil of the rechargeable power source by inductive charging.

* * * * *